United States Patent [19]

Gievers

[11] 4,272,194

[45] Jun. 9, 1981

[54] ROTATION SENSITIVE RING LASER SYSTEM

[75] Inventor: John G. Gievers, Rochester, Mich.

[73] Assignee: Christa L. Gievers, Rochester, Mich.

[21] Appl. No.: 939,250

[22] Filed: Sep. 5, 1978

[51] Int. Cl.³ ............................................. G01C 19/64
[52] U.S. Cl. ..................................... 356/350; 250/225
[58] Field of Search .................. 356/350, 351; 250/225

[56] References Cited

U.S. PATENT DOCUMENTS

| 3,692,385 | 9/1972 | Gievers | 350/157 |
| 3,841,758 | 10/1974 | Gievers | 356/350 |

Primary Examiner—Ronald J. Stern
Assistant Examiner—Bruce Y. Arnold
Attorney, Agent, or Firm—Barnes, Kisselle, Raisch & Choate

[57] ABSTRACT

A rotation sensitive ring laser system comprising an optical loop including a polarizing beam splitter in the loop, the laser gain medium being outside the loop, and a quarter wave plate in the path of light emanating from the loop for converting the light into linearly polarized light, the plane of polarization of which is rotating at an angular rate proportional to the angular rate with which the system is rotating in inertial space.

22 Claims, 12 Drawing Figures

FIG. 3a

$\omega \neq 0$
$t_1 = t$

GAIN MED.

FIG. 3b

$\omega \neq 0$
$t_2 = 2t$

GAIN M.

FIG.4a

PHASE

FIG.4b

EMERGING FROM PB1

FIG.4c

GAIN MEDIUM

FIG.4d

INCIDENT IN PB1

ROTATION SENSITIVE RING LASER SYSTEM

This invention relates to rotation sensitive systems such as are used in guidance and navigational systems to sense rotation in inertial space.

BACKGROUND AND SUMMARY OF THE INVENTION

In a ring laser gyro measuring rotation by means of coherent light traveling in opposite directions around a loop, a difference in light frequencies arises between the two counter-circulating beams when the loop is rotated in inertial space.

The difference in the frequency is proportional to the angular rate $\omega$ of the loop rotation in inertial space. By superimposing or heterodyning the two light-beams, and feeding the light output to a photodetector, a beat-frequency signal is obtained, which is indicative of the angular rate $\omega$.

Below a certain rate threshold, however, the separate oscillations of the opposite traveling beams are no longer sustained, because of the mode-locking phenomenon. The two modes become pulled into synchronization by cross coupling arising from the scattering of the gas molecules within the laser gain medium.

Many methods have been devised to overcome or reduce the rate threshold caused by the lock-in phenomenon. The best known is biasing, like dithering. These additional correction methods, however, do not remove the original source of the error and are limited in performance. Their limitations have to be considered as the practical rate threshold of the ring laser system. If the mode-locking phenomenon itself could be removed, a laser rate sensor far superior in accuracy to any existing gyro would be feasible. The laser rate sensor could operate at the fundamental limit set by the noise process of spontaneous emission. According to the literature, this limit is so low that its detection is virtually impossible. See IEEE Spectrum Oct. 1967 "The laser gyro" by Joseph Killpatrick, Honeywell Inc., p. 51–53.

The present invention avoids mode-locking at the outset by avoiding two different light frequencies in the amplifier medium. This is achieved by utilizing the polarization of the light. The two opposite traveling linearly polarized light beams are superimposed in the gain medium in such a way as to form always linearly polarized light oscillating with a constant frequency the same as when the angular rate $\omega$ is zero. This is accomplished by the proper application of a simple quarter wave plate in a specific ring interferometer arrangement proposed by U.S. Pat. No. 3,692,385.

Since the laser rate sensor of the present invention avoids mode-locking altogether and at the same time any null shift errors, which may be caused by gas flow in the discharge cavity, an optical rate sensor of an exceptional high accuracy is feasible.

DESCRIPTION

Figure 1:
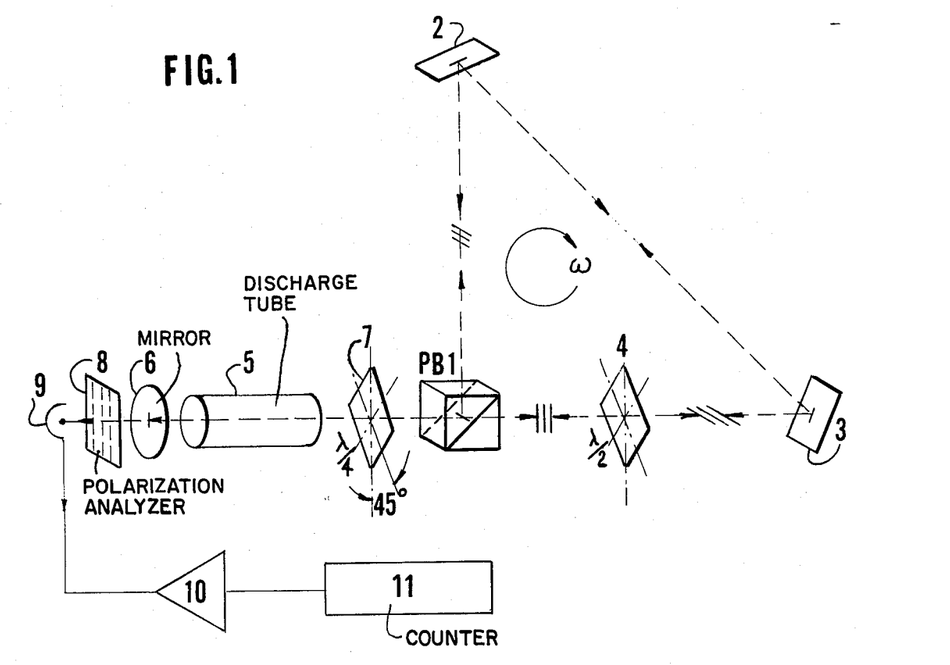
FIG. 1 is a schematic diagram of a rotation sensitive ring laser system embodying the invention.

One form of the proposed ring laser system is illustrated in FIG. 1. The optical loop of this arrangement contains the polarizing beamsplitter PB 1, two corner mirrors 2 and 3 and a half wave plate 4. The beamsplitter PB 1 splits the incident light into two orthogonal linearly polarized components whereby the component traveling clockwise (cw) around the loop oscillates perpendicular to the plane of the paper, as indicated by the three dashes across the light beam. The counter-clockwise (ccw) traveling component oscillates parallel with the paper plane. The half wave plate 4 exchanges the oscillating planes of the opposite traveling beams and renders feasible their recombination by the beamsplitter PB 1. The linearly polarized light emerging from the beamsplitter PB 1, when no angular rate $\omega$ of the system in inertial space exists, oscillates in a plane tilted 45° to the plane of the paper.

The light incident on the beamsplitter PB 1 and the loop emanates from the gain medium in discharge tube 5 which may be filled with Ne He. End mirror 6 of the ring laser is partially transparent. The main part of the light is reflected by the mirror 6 into the beamsplitter PB 1 and the loop from where it returns to the mirror 6. The length from the mirror 6 around the loop and back to mirror 6 represents the actual laser cavity.

The smaller portion of the light is transmitted through the end mirror 6 to the polarization analyzer 8 and the photo-detector 9. The analyzer 8 may be a Nicol prism or a simple sheet of polaroid as in FIG. 1. The photo-current generated in the photo-detector 9 is amplified in the amplifier 10. The rate of the amplified electrical pulses may be counted in the counter 11 to produce a measure of the angular rate at which the system is rotated in inertial space.

A quarter wave plate 7 is installed between the discharge tube 5 and the beamsplitter PB 1. The principal optical axes of this plate are inclined 45° to the plane of the paper, i.e., they are parallel and perpendicular to the oscillating plane of the linearly polarized light beam incident onto the beamsplitter PB 1 when $\omega = 0$. Because of reasons explained later, the discharge tube 5 is not equipped in the usual way with Brewster windows. The end faces of the discharge tube are perpendicular to the light beam direction.

OPERATION

Angular Rate Zero

Figure 2:
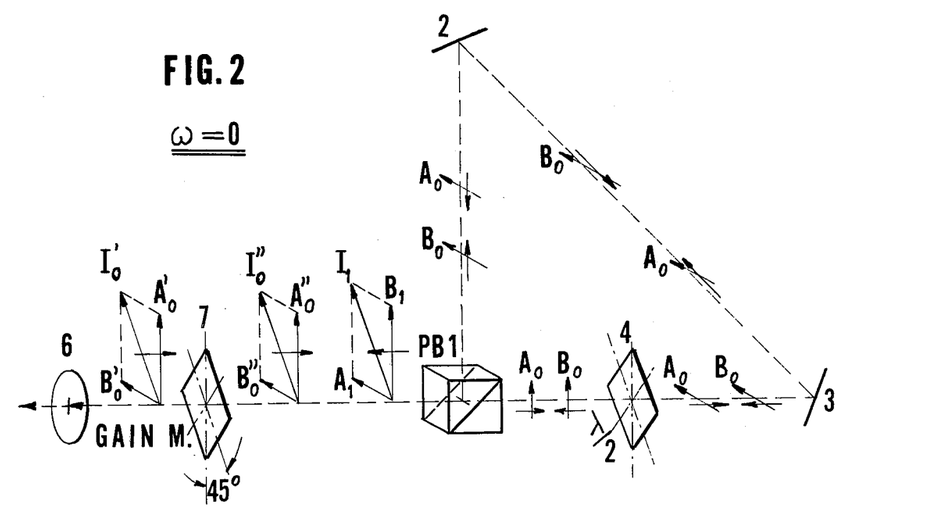
FIG. 2 is a schematic ray diagram of the system shown in FIG. 1 at a zero angular rate.

In order to discuss the operation of the optical rate sensor, a schematic is shown in FIG. 2 in which the light vectors are displayed at certain points of the optical circuit when the angular rate is zero. Otherwise, the physical arrangement of FIG. 2 is exactly the same as that of FIG. 1. Only the polarization analyzer 8, the photo-detector 9 and the electrical circuit are omitted.

Because of the polarizing effect of the beam-splitter PB 1, the light emitted from the gain medium in the discharge tube 5 is linearly polarized and is oscillating in a plane tilted 45° as indicated by the vector $I_0'$. This linearly polarized light passes through the quarter wave plate 7 absolutely unchanged because it oscillates parallel to one of the principal optical axes. It emerges from the plate 7 as vector $I_0''$ which is identical with $I_0'$.

The location of the light vector is indicated in the figures; a single prime designation such as $I_0'$ is the vector located in the gain medium; a double prime designation such as $I_0''$ indicates the vector between the $\lambda/4$ plate 7 and the beamsplitter PB 1, traveling in the direction toward the beamsplitter PB 1. Vectors without a prime such as $A_0$ or $I_0$ designate the light in the loop and the light emerging from the loop and the beamsplitter PB 1. The subscripts like $I_0$, $I_1$, - - - $I_x$ indicate the number of trips of the light around the loop.

The vector $I_0''$ can be split up into two orthogonal components of equal length, the component $A_0''$ oscillating in the plane of the paper and the component $B_0''$ oscillating perpendicular to it. The beamsplitter PB 1 separates the incident light $I_0''$ into these two orthogonal components. The light oscillating in the plane of $A_0''$ is transmitted straight through the beamsplitter PB 1 and travels counterclockwise around the loop as $A_0$. The light oscillating in the plane of $B_0''$ which is perpendicular to the paper plane is deflected 90° in the beamsplitter PB 1 and travels clockwise around the loop as the vector $B_o$ in a direction opposite to $A_0$. The vectors $A_0$ and $B_0$ and the direction of propagation around the loop are indicated in FIG. 2 by arrows.

The plane of oscillation of both components $A_0$ as well as $B_0$ are rotated 90° by the half wave plate 4. The result is an exchange of the plane of oscillation of the emerging light components $A_1$ and $B_1$ with respect to each other and with respect to that of the originally incident light components $A_0''$ and $B_0''$. Hence the emerging vector $B_1$ oscillates in the plane of the incident vector $A_0''$ and the emerging vector $A_1$ in the plane of the incident vector $B_0''$. But the resultant vector $I_1$ oscillates as before in the original plane of the incident resultant vector $I_0''$ as FIG. 2 shows.

Hence the vector $I_1$ can pass through the quarter wave plate 7 again unchanged. Nothing happens when the quarter wave plate 7 is removed, apart from shortening the optical length of the laser cavity. But otherwise the laser could oscillate in the same way as before.

EFFECT OF ANGULAR RATE

Figure 3A:
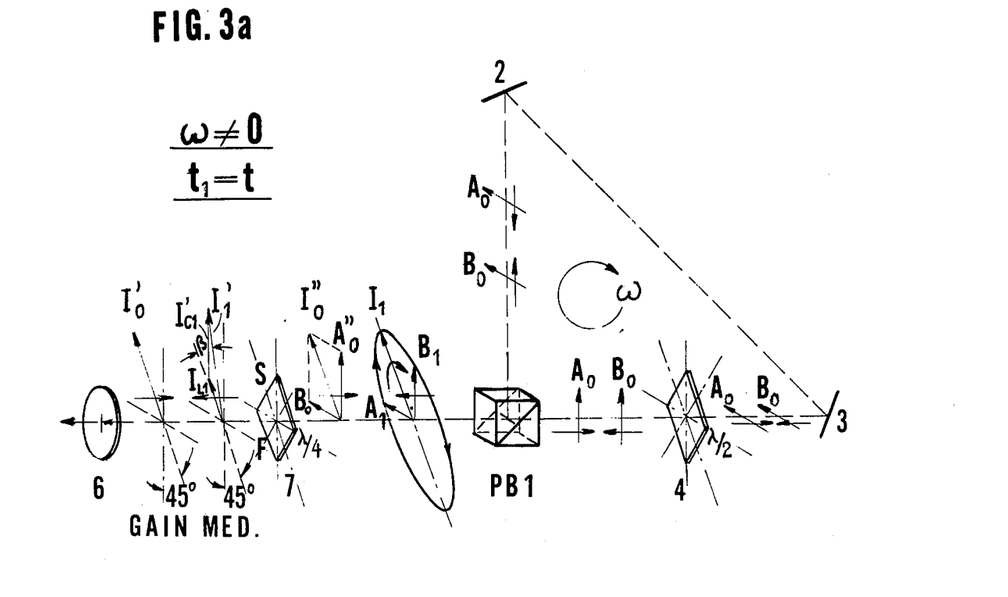
FIGS. 3a and 3b are schematic ray diagrams of the system shown in FIG. 1 at different angular rates.
Figure 3B:
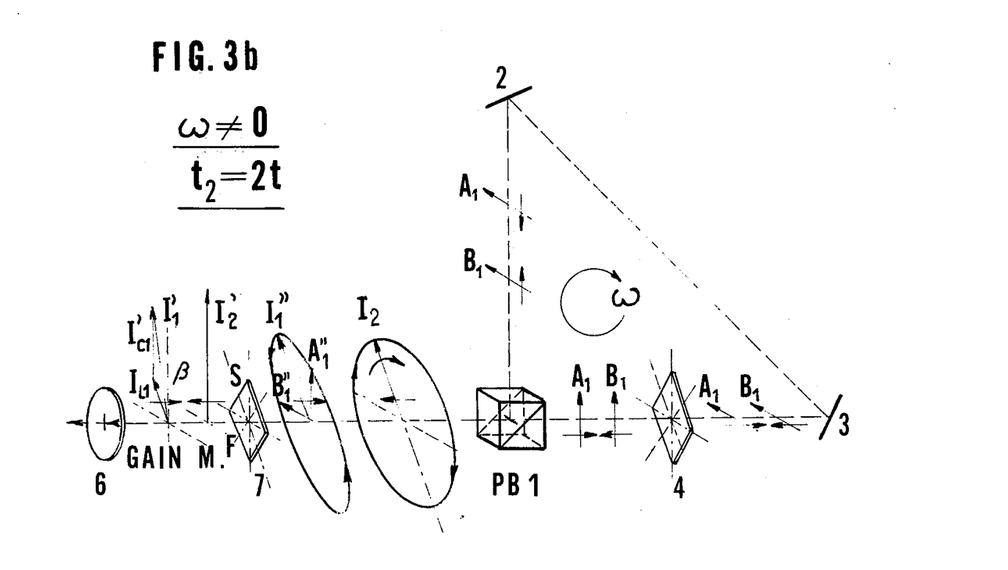

When the optical rate sensor is exposed to an angular rate $\omega$ the situation changes. Now the quarter wave plate 7 plays a crucial role. This is illustrated by FIGS. 3a and 3b which show the vector diagrams of the light at the different times $t_1$ and $t_2$ at different points of the optical circuit when an angular rate $\omega$ exists. The FIG. 3a shows the light vectors after a certain time period t has elapsed at the time $t_1$, and the FIG. 3b shows the light vectors at the time $t_2$ after the time period of 2t has elapsed.

As the result of the angular rate $\omega$, the components $A_1$ and $B_1$ do not emerge from the beamsplitter PB 1 at the same instant but are shifted in time with respect to each other. If we assume the loop is rotated at an angular rate $\omega$ in clockwise direction, the light component $A_0$ traveling counterclockwise will arrive earlier at the beamsplitter PB 1 than the clockwise traveling vector $B_0$. The vector $A_0$ will arrive earlier because its optical path length is shortened by the same amount as that of the component $B_0$ is increased. The result is a phase shift angle of $2\delta$ between the emerging vector $A_1$ and $B_1$. Hence the vectors $A_1$ and $B_1$ will not recombine to linearly polarized light as they did when $\omega$ was zero, as shown in FIG. 2, but will recombine to elliptically polarized light. The emerging resultant vector $I_1$, therefore, will not oscillate in a plane but will rotate. Its endpoint will trace an ellipse.

In the absence of the quarter wave plate 7 from the optical circuit, the elliptically polarized light is reflected by the end mirror 6 and incident a second time in the beamsplitter PB 1. But the second time the component $A_1$ would travel around the loop in the clockwise direction, i.e., in the opposite direction than the component $A_0$ traveled on the first trip, as can be realized easily with the help of FIG. 2. The same will happen with the component $B_1$ which travels in the opposite direction to $B_0$ because $B_1$ and $B_0$ are orthogonal as well. As a result, the phase shift between the two components $A_1$ and $B_1$ caused in the first round trip by the angular rate $\omega$ is cancelled in the second round trip.

The presence of the quarter wave plate 7 changes the situation drastically. As known, elliptically polarized light is composed of a linearly polarized light portion and a circularly polarized light part. At small phase shift angles between $A_1$ and $B_1$, the major axis of the ellipse of the elliptically polarized light lies in the same 45° azimuth plane as in the case $\omega=0$. The linearly polarized light component $I_1$ oscillates in the plane of the major axis of the ellipse and passes through the quarter wave plate 7 unchanged, as before.

In contrast, the circularly polarized light is converted by the quarter wave plate 7 into linearly polarized light. Since the principal optical axes of the quarter wave plate 7 are inclined 45° to the plane of the paper, the converted linearly polarized light component $I_{C1}'$ will oscillate in a horizontal or vertical plane depending on the direction of the fast and the slow optical plate axis. In FIG. 3a, it is assumed that the slow and the fast axes of the quarter wave plate lie in a direction as indicated by the letters S and F (S=slow, F=fast). In this case, the emerging converted linearly polarized light component $I'_{C1}$ oscillates in the vertical plane.

At emergence from the quarter wave plate 7, the two light components $I_{L1}$ and $I_{C1}$ are combined to the resultant $I_1'$. This resultant linearly polarized light $I_1'$ in the gain medium is oscillating in a plane which is rotated at the angle $\beta$ against the original 45° azimuth plane of $I_0'$.

The light $I_1'$ is reflected by the end mirror 6 and passes through the quarter wave plate 7 a second time in the opposite direction. As a result, the linearly polarized light component $I_{C1}'$ is again converted back into circularly polarized light. This time, however, the handedness of the circular light is inverted. If we look, as before, from the mirror 6 in the direction to the beamsplitter PB 1, the light vector $I_1''$ rotates counterclockwise as indicated by the circular arrow in FIG. 3b and not in the clockwise direction as the vector $I_1$ did. The $\lambda/4$ plate 7 has inverted the handedness of the circularly polarized component $I_{C1}''$ of the returning light $I_1''$.

The light $I_1''$ is incident again on the beamsplitter PB 1. As before, the beamsplitter PB 1 splits the vector $I_1''$ into two components, the component $A_1''$ oscillating in a vertical plane and the component $B_1''$ oscillating in a horizontal plane. But the component $A_1''$ precedes the component $B_1''$ at the phase angle $2\delta$, as explained before.

Since the vertical component $A_1$ travels around the loop in counterclockwise direction in the same direction as the component $A_0$ did before, and $B_1$ travels clockwise as $B_0$ before, the phase angle between the components is doubled and not canceled. Hence the emerging recombined vector $I_2$ is again elliptically polarized whereby the circularly polarized light portion is twice as large. The short axis of the ellipse is twice the size as before. But the handedness of the emerging resultant $I_2$ is clockwise, i.e., opposite again to that of the incident light $I_1''$ (FIG. 3b).

When the light $I_2$ passes through the λ/4 plate 7, the same happens as before. The linearly polarized component $I_{L2}$ is transmitted unchanged, but the increased circular component $I_{C2}$ is converted into linearly polarized light, oscillating in the vertical plane. Because of the increased portion of the circularly polarized light, compared with the linearly polarized part, a larger linearly polarized light component oscillating in the vertical plane will emerge from the quarter wave plate 7. The resultant linearly polarized light in the gain medium will oscillate, therefore, in an azimuth plane rotated at the increased angle of 2β.

As can be realized, the phase shift between the two opposite traveling light components increases with every round trip. When the phase shift between the two opposite traveling components has reached an angle of $\delta = 90° = \lambda/4$, then the light emerging from the beamsplitter PB 1 will be circularly polarized altogether. This case is illustrated actually in FIG. 3b.

The described process repeats itself again and again. The result is a rotation of the plane of polarization of the linearly polarized light in the gain medium. The angular rate of this rotation is proportional to the angular rate with which the laser system is rotated in inertial space.

Although two different frequencies of the opposite traveling light beams exist in the loop, the light in the gain medium, which is composed of these two counter-traveling light components, always oscillates with the same constant frequency. The light in the gain medium is always linearly polarized. The plane of polarization rotates with an angular rate which is proportional to the difference in frequency of the two counter-traveling light components in the loop.

It is not significant if the quarter wave plate 7 is rotated 90° around the light beam axis, i.e., if the fast and the slow axes are exchanged. This will reverse only the direction of rotation of the azimuth angle β. The azimuth plane of the linearly polarized light in the gain medium will rotate in the opposite direction.

POLARIZATION —FORM CHANGES IN DETAIL

In order to obtain a better concept about the optical events in the proposed laser arrangement over a prolonged time period, the light-vector diagrams displayed in FIGS. 2 and 3 are shown again independently in FIGS. 4a–d over a longer time period.

The diagrams are displayed in a perpendicular view when the observer is looking from mirror 6 in direction to the beamsplitter PB 1 and not perspectively as in FIGS. 2 and 3.

Figure 4A:
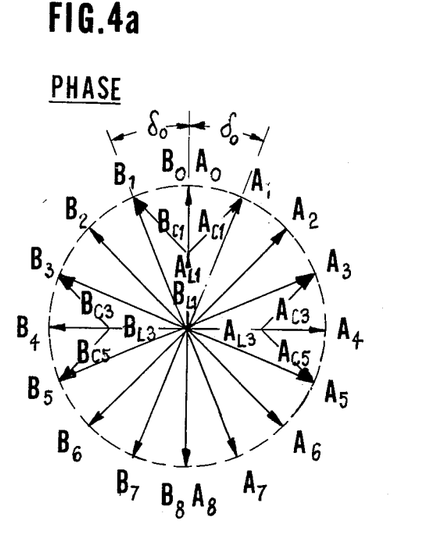
FIGS. 4a, 4b, 4c and 4d are light vector diagrams of the light at various points in the system.

The FIG. 4 contains the following vector diagrams:

FIG. 4a exhibits the phase shift between counter-traveling components $A_x$ and $B_x$, when the light is emerging from the optical loop and the beamsplitter PB 1 after constant intervals t.

Figure 4B:
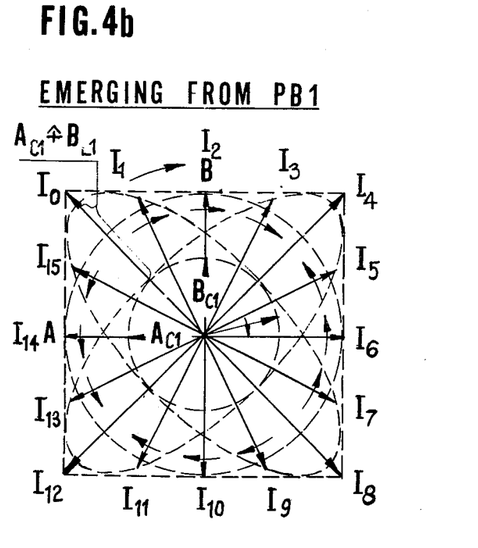

FIG. 4b illustrates the polarization-form of the light emerging from the beamsplitter Pb 1 after each time period t.

Figure 4C:
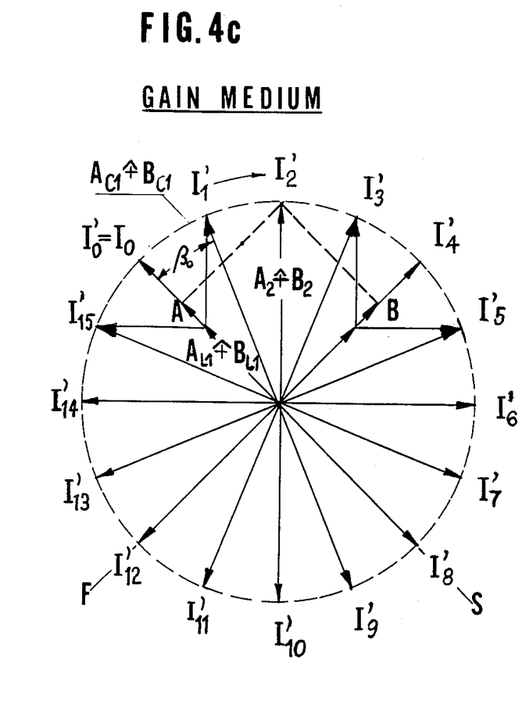

FIG. 4c displays the linearly polarized light and its azimuth in the gain medium 5.

Figure 4D:
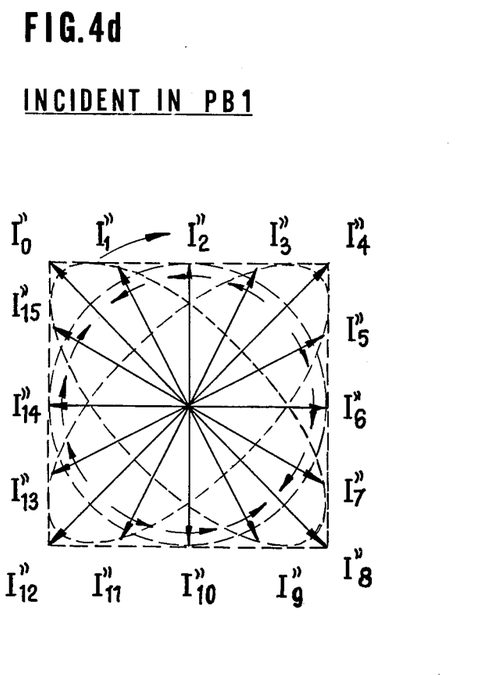

FIG. 4d shows the polarization-form of the light when incident onto the beamsplitter PB 1 after it has been transmitted through the λ/4 plate 7 a second time after each period t.

LIGHT EMERGING FROM BEAMSPLITTER PB 1 FIGS. 4a and 4b

The vector diagram of FIG. 4a displays the phase shift between the light components $A_x$ and $B_x$ after each round trip around the loop at the moments $t_0$, $t_1$, $t_2$- - - $t_x$. The constant time period t between these moments is chosen such that a phase shift angle $\delta_0 = 22\frac{1}{2}°$ occurs in each counter-traveling light beam when the optical loop is rotated with a certain constant angular rate ω. For the sake of simpler comprehension, it can be assumed, the angular rate ω and the size of the loop being large enough, that every time the light travels around the loop once, the phase shift of each of the two emerging components is increased at the angle $\delta_0$.

Since the component $A_x$ is advanced with each round trip at an angle of $\delta_0 = 22\frac{1}{2}°$ and the vector $B_x$ is delayed at the same amount, the total phase shift between the two components $A_x$ and $B_x$ at the time $t_x$ will be $\delta = 2\delta_0 x$ whereby X is the number of round trips.

The vector diagram of FIG. 4b shows the polarization-form of the light emerging from the beamsplitter PB 1 after each round trip at the moments $t_0$, $t_1$- - - $t_x$.

In the following the phase angle δ between the components $A_x$ and $B_x$ as shown in FIG. 4a and the resultant light $I_x$ as it emerges from the beamsplitter PB 1 is discussed at each instant $t_0$, $t_1$- - - $t_x$ step by step.

INSTANT $t_0$

At the time $t_0$, the elapsed time is zero. The components $A_0$ and $B_0$ when emerging from the loop will be in phase. The resultant vector $I_0$ will be linearly polarized. The light will emerge from the beamsplitter PB 1 oscillating in the 45° azimuth plane, as in the case when ω was 0. This is indicated in FIG. 4a by the vectors $A_0$ and $B_0$ which fall together and in FIG. 4b by the vector $I_0$ which oscillates in a plane turned 45° against the vertical.

INSTANT $t_1$

After the first round trip, the phase angle between components $A_1$ and $B_1$ increased to $\delta = 2 \times 22\frac{1}{2}° = 45°$. This time the resultant light $I_1 = A_1 \mathbin{\unicode{x2295}} B_1$ is elliptically polarized as illustrated in FIG. 4b. As shown in FIG. 4a, each component of light can be divided in two subcomponents. The component $A_1$ can be subdivided into components $A_{L1}$ and $A_{C1}$. In the same way, the component $B_1$ can be subdivided into components $B_{L1}$ and $B_{C1}$. The components $A_{L1}$ and $B_{L1}$ are in phase. The components $A_{C1}$ and $B_{C1}$, however, are 90° out of phase.

The resultant $\frac{1}{2} I_0 = A_{L1} \mathbin{\unicode{x2295}} B_{L1}$ of the vector $A_{L1}$ and vector $B_{L1}$ represents again linearly polarized light oscillating in the 45° azimuth plane as indicated in FIG. 4b. The vectors $A_{C1}$ and $B_{C1}$ result in circularly polarized light. $A_{C1}$ is maximum when $B_{C1}$ is zero.

The geometrical sum of these linearly and circularly polarized components results in elliptically polarized light as shown in FIG. 4b by the vector $I_1$. If we assume again the direction of the angular rate clockwise, as before, then the vector $I_1$ in the diagram FIG. 4b rotates in the clockwise direction as well. The direction of rotation of the vector $I_1$ is indicated in FIG. 4b by the circular arrow across the vector $I_1$.

INSTANT $t_2$

After two round trips, the phase shift between $A_2$ and $B_2$ has reached the angle $\delta = 4 \times 22\frac{1}{2}° = 90°$. Now the light emerging from the beamsplitter PB 1 will be completely circularly polarized. The resultant light vector $I_2$ will rotate clockwise, as before, as indicated in FIG. 4b and trace a circle. The component $A_2$ will emerge first and the vector $B_2$ at a phase angle of 90° later, i.e., component $A_2$ will be already zero when the maximum of component $B_2$ emerges from beamsplitter PB 1.

INSTANT $t_3$

The vector $B_3$ which traveled around the loop three times will be delayed against the vector $A_3$ at the phase angle $\delta = 2 \times 3 \times 22\frac{1}{2}° = 135°$, as shown in FIG. 4a. Again, we can split up the vector $A_3$ into components $A_{L3}$ and $A_{C3}$ and the vector $B_3$ into components $B_{L3}$ and $B_{C3}$, as indicated in FIG. 4a. The components $A_{L3}$ and $B_{L3}$ are parallel but opposite, i.e., $\delta = 180°$. This means component $A_{L3}$ is positive when component $B_{L3}$ is negative and vice versa.

When these two components which are geometrically rotated against each other at an angle of 90° are summarized, linearly polarized light results. The azimuth plane, however, is rotated 90° against the plane of the vector $I_0$. This can easily be realized by FIG. 4b. When we reverse the direction of component B but leave component A in the original direction, the resultant vector $I_4$ is rotated 90°.

A circularly polarized component is superimposed over the linearly polarized light component oscillating in the plane of $I_4$. The circularly polarized light derives from the vectors $A_{C3}$ and $B_{C3}$ which are perpendicular to each other. Since again component $A_{C3}$ precedes component $B_{C3}$ by 90°, the emerging light vector circulates again clockwise.

The summation of the linearly and circularly polarized light results again in elliptically polarized light and the resultant vector $I_3$ rotates clockwise, as FIG. 4b reveals.

If we compare the ellipse traced by the vector $I_3$ with that of the vector $I_1$, we see that both are identical. Both vectors $I_1$ as well as $I_3$ rotate clockwise. But the major axis of the two ellipses are turned in azimuth at an angle of 90° to each other.

INSTANT $t_4$

The vectors $A_4$ and $B_4$ are at an angle of $\delta = 2 \times 4 = 180°$ out of phase. As a result, the resultant vector $I_4$ is linearly polarized, but the light is oscillating in a plane rotated 90° with respect to the azimuth plane of $I_0$ as FIG. 4b shows.

INSTANT $t_5$

The vectors $A_5$ and $B_5$ can be split again into two components because the phase angle between them amounts to 225° as FIG. 4a shows. The components $A_{L5}$ and $B_{L5}$ are 180° out of phase. They result, therefore, in linearly polarized light oscillating in the same azimuth plane as vector $I_4$. The two other components $A_{C5}$ and $B_{C5}$ are perpendicular to each other and result, therefore, in circularly polarized light. But this circularly polarized light is orthogonal to the circularly polarized light discussed before. The handedness is reversed. As a result, the vector $I_5$ traces the ellipse in counterclockwise direction, i.e., opposite to that of the vector $I_3$. Otherwise, the ellipses of $I_3$ and $I_5$ are identical as FIG. 4b shows.

INSTANT $t_6$, $t_7$, etc.

We could continue with the explanation of the vectors $I_6$, $I_7$, etc., in the same way as before. But from the above, it is sufficiently clear that the vector $I_6$ represents again circularly polarized light, the vector $I_7$ elliptically polarized light, whereby the ellipse is identical with that of $I_1$ only that the vector $I_7$ rotates counterclockwise, i.e., in the opposite direction of $I_1$.

The vector $I_8$ represents again linearly polarized light oscillating in the azimuth plane of vector $I_0$, etc. These and the following vectors $I_9$ to $I_{14}$ as shown in the vector diagram of FIG. 4b, from which the polarization forms are easily discernible.

Summarizing we can state: The light emerging from the beamsplitter PB 1 changes from linearly polarized light oscillating in the azimuth plane of $I_0$ to elliptically and circularly polarized light and again into linearly polarized light after a phase angle $\delta$ of 180° between the components $A_4$ and $B_4$ has been reached. The resultant vectors $I_0$ and $I_4$ are orthogonal. Up to this point, the circular polarization keeps the same direction of circulation. When the light after vector $I_4$ changes again into elliptically and circularly polarized light, etc., the handedness is reversed as is illustrated in the diagram FIG. 4b.

LIGHT IN GAIN MEDIUM FIG. 4c

Now we examine the light in the gain medium at the same time intervals as before. As mentioned, the light emerging from the beamsplitter PB 1 is always converted by the $\lambda/4$ plate 7 into linearly polarized light, as shown in FIG. 4c.

INSTANT $t_0$

The light emerging from the beamsplitter PB 1 at the instant $t_0$ is linearly polarized oscillating in the 45° azimuth plane. Since this plane is parallel to the optical axis of the $\lambda/4$ plate 7, it will pass through it unchanged, as is indicated in FIG. 4c by $I_0' = I_0$. At the instant $t_0$ the light in the gain medium is, therefore, linearly polarized oscillating in the original 45° azimuth plane.

INSTANT $t_1$

At the instant $t_1$, the components $A_1$ and $B_1$ are shifted against each other at the angle $\delta = 2/8 \lambda = 45°$ (FIG. 4a). The light emerging from the beamsplitter PB 1 is elliptically polarized as shown in FIG. 4b. One half of the elliptically polarized light is linearly polarized, the other half circularly.

The linearly polarized component $A_{L1} \dotplus B_{L1}$ passes through the $\lambda/4$ plate 7 unchanged. The circular component is converted into linearly polarized light. Because of the position of the slow axis S of the $\lambda/4$ plate, as indicated in FIG. 4c, the converted linearly polarized light emerging from the $\lambda/4$ plate oscillates in the vertical azimuth plane. The resultant $I_1'$ of the two linearly polarized light components $A_{L1} \dotplus B_1$ and of the circular component $A_{C1} \dotplus B_{C1}$ is rotated against vector $I_0'$ in the clockwise direction at an angle of $\beta_0 = 22\frac{1}{2}°$. Hence, we have in the gain medium again linearly polarized light oscillating in an azimuth plane rotated at the angle $\beta_0$.

INSTANT $t_2$

At the instant $t_2$ only circularly polarized light emerges from the beamsplitter PB 1 as FIG. 4b shows. The handedness of this light is clockwise. It is converted by the λ/4 plate into linearly polarized light oscillating in the vertical plane. The vector $I_2'$ oscillates in an azimuth plane rotated at an angle $2\beta_0 = 45°$ against the plane $I_0'$.

INSTANT $t_3$

As shown in FIG. 4b, the light emerging from the beamsplitter PB 1 is again elliptically polarized light, whereby however the major axis of the ellipse is shifted 90° against the azimuth of $I_0$. Since the handedness of the circularly polarized light is the same as before, the light converted by the λ/4 plate 7 oscillates again in the vertical position as before. This converted linearly polarized light is added to the linear component which again passes unchanged through the λ/4 plate and adds up to the vector $I_3'$. The resultant $I_3'$ is shifted at the angle of $3\beta_0 = 67\frac{1}{2}°$.

INSTANT $t_4$

The resultant $I_4$ according to FIG. 4b is again linearly polarized. The vector $I_4'$ oscillates, therefore, again in the plane of the optical axis of the λ/4 plate and passes through unchanged. As a result, the vector $I_4'$ will oscillate in a plane rotated at an angle of $4\beta_0 = 90°$ against $I_0'$.

INSTANT $t_5$, etc.

The resultant $I_5'$ is derived from linearly and circularly polarized light. Since the elliptically polarized beams $I_1$ and $I_5$ are orthogonally polarized as FIG. 4b shows, i.e., the major axis of the ellipse is rotated 90° and the handedness of the circular component is reversed, the linearly polarized components of $I_5'$ as FIG. 4c shows are both shifted 90° to those of $I_1'$. As a result, the vector $I_5'$ is rotated at an angle of $5\beta_0 = 112.5°$ against $I_0'$.

After the above discussion, the position of the light components in the gain medium at later periods $t_x$ can be easily derived.

Generally, it can be stated: The light in the gain medium is always linearly polarized and oscillates with a constant frequency. The plane of the polarization rotates with a rate which is proportional to the angular rate ω of the system in inertial space.

LIGHT INCIDENT ONTO THE BEAMSPLITTER PB 1 FIG. 4d

The linearly polarized light after being reflected by the end mirror 6 passes through the λ/4 plate 7 a second time. This time the linearly polarized light of the gain medium is reconverted into linearly, elliptically or circularly polarized light depending on the relative position of the plane of polarization to the optical axis of the λ/4 plate 7. However, the returning light is reversed in the handedness of the circularly polarized light component. The FIG. 4d which shows the light vectors located between the λ/4 plate 7 and the beamsplitter PB 1 illustrates this. The diagram FIG. 4d is identical with that of FIG. 4b of the emerging light from the beamsplitter PB 1, except for the handedness of the circularly polarized light component. The vectors $I_1''$, $I_3''$, $I_5''$, etc., of the elliptically polarized light always rotate, threfore, in the opposite direction of the vectors $I_1$, $I_3$, $I_5$, etc., as indicated by the circular arrow across these vectors.

With diagram FIG. 4d, the ring is closed. To see the conversion of the light as it travels through the optical circuit, we need only to go from FIG. 4d back to FIG. 4b and follow the number of the subscripts. This way we can trace without difficulty the optical events in the proposed laser system over a prolonged time period.

As a result of these considerations, it is clear that in the gain medium the light is always linearly polarized and oscillates in a plane which rotates proportional with angular rate of the whole system in inertial space. Since the frequency of light oscillation in the gain medium is always constant, mode-locking cannot exist.

OTHER DESIGN CONFIGURATIONS

CONFIGURATION FIG. 1

In view of the above discussion, it can be seen easily how the angular rate ω in inertial space can be measured with the arrangement shown in FIG. 1. A small portion of the linearly polarized light passes through the end mirror 6 and the polarization analyzer 8 to the photodetector 9. When the plane of polarization turns, the light intensity at the photodetector 9 changes. When the plane of polarization lies parallel to the plane of transmission of the polarization analyzer 8, all the light emerging from the end mirror 6 falls on the photodetector 9. When the plane of polarization is perpendicular to the plane of transmission, the light is blocked. The result is a fluctuation of the light at the photodetector 9 when the plane of polarization in the gain medium rotates. With every revolution of the plane of polarization two light oscillations occur at the photodetector 9. The result is a sinusoidally changing photocurrent, the cycles of which can be counted by the counter 11. The number of cycles are a measure of the angle about which the entire system has been rotated in inertial space.

CONFIGURATION FIG. 5

The accuracy of the measuring method can be highly enhanced by measuring the angle instead of counting cycles. The azimuth angle of the polarized light can be measured with an accuracy of better than 1 second of arc.

Figure 5:
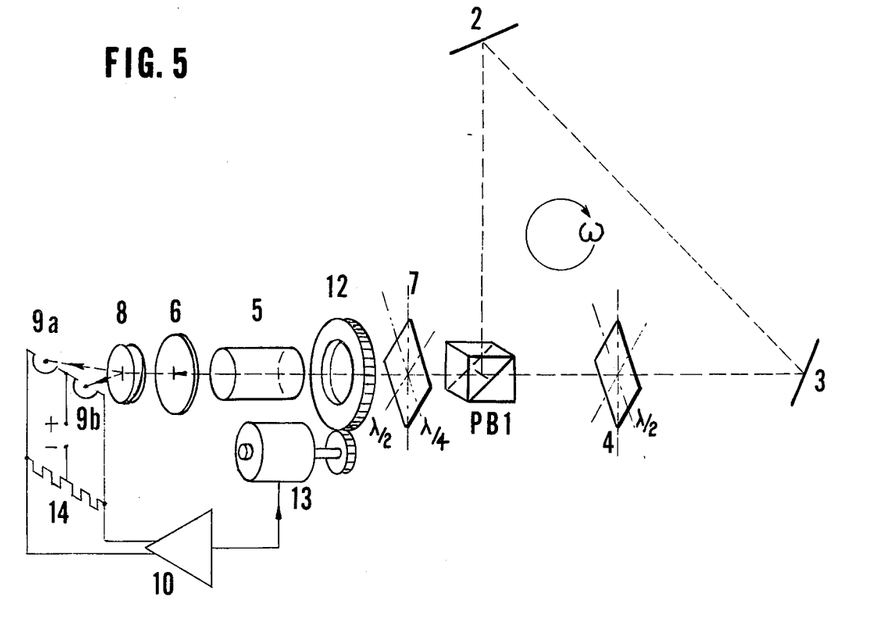
FIG. 5 is a schematic diagram of a modified system.

How such accuracy can be achieved is illustrated in FIG. 5. In FIG. 5, the rotation of the plane of polarization in the gain medium is compensated for by a half wave plate 12, turned by the servo 13. The revolving half wave plate 12 is inserted between the discharge tube 5 and the λ/4 plate 7. The half wave plate 12 is rotated by the servo motor 13 such that the angle of rotation of the plane of polarization in the gain medium is always kept in its zero position. This is accomplished by the photodetectors 9a and 9b which feed the servo 13 via the amplifier 10.

Instead of a simple polaroid sheet as in FIG. 1, a Wollaston prism 8 is applied in FIG. 5 as a polarization analyzer. With a Wollaston prism, the linearly polarized light emerging from the end mirror 6 is divided into two orthogonally polarized components. If the plane of polarization is rotated against the Wollaston prism 8, the light intensity at the one photodetector like 9a increases while the intensity in the second photodetector 9b decreases. The result is a photocurrent to the amplifier 10 which is proportional to the difference in current from 9a and 9b. The photodetectors 9a and 9b are connected with the resistor 14 in a bridge circuit. In the zero position of the plane of polarization, both light beams emerging from the Wollaston prism are of equal intensity. The same is true for the photocurrents generated in the two photodetectors. As a result, the photocurrent to the amplifier 10 is zero in the zero position of the plane of polarization. If the plane of polarization rotates out of the zero position, the amplifier 10 receives a positive or negative signal according to the direction of rotation of the plane of polarization. Then the servo motor 13 receives a current from the amplifier 10 which causes it to turn the half wave plate 12 such that the zero position of the plane of polarization in the gain medium is restored.

It is clear that the angle about which the servo 13 turns the half wave plate 12 is proportional to the angle of rotation of the entire laser system in inertial space. To control the servo only a small error deflection of the plane of polarization with respect to its zero position is required. Because of the small deflection angle, the discharge tube 5 can be equipped in the usual way with Brewster windows in the arrangement of FIG. 5. The Brewster windows would not prevent the required small angular deflection of the plane of polarization.

It may be mentioned that the half wave plate 12 can be located also between the end mirror 6 and the Wollaston prism 8. In this case, of course, the plane of polarization would rotate in the gain medium the full 360° and the Brewster windows at the discharge tube would not be feasible.

The mechanical rotation of the half wave plate, as discussed, has the advantage that the arrangement could be used as a kind of a master compass to feed repeater-compasses, for instance on board ship.

CONFIGURATION FIG. 6

Figure 6:
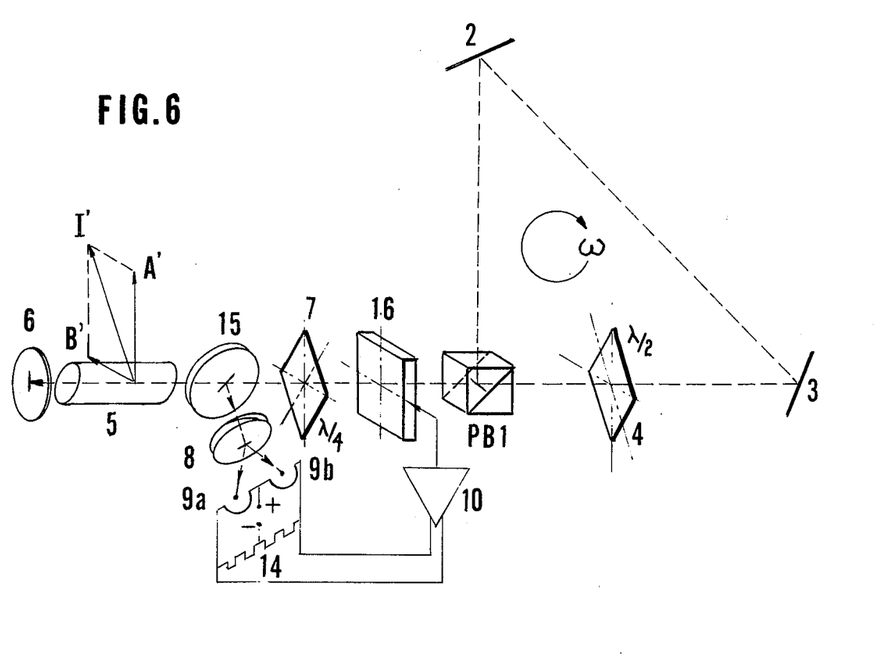
FIG. 6 is a schematic diagram of another modified system.

If mechanical moving parts like the rotating half wave plate 12 and servo 13 are not desired, still another configuration which avoids any moving parts is feasible. Such a configuration is shown in FIG. 6 in which the rotation of the plane of polarization in the gain medium is compensated by a light modulator 16. The light modulator can be a photoelastic retardation modulator or some other kind of commercially available modulator like a Pockel cell. The optical axis of the modulator 16 is aligned parallel, respectively vertically, to the plane of the paper, i.e., it is tilted 45° to the zero plane of oscillation of polarized light emerging from the beamsplitter PB 1. In the FIG. 6, the signal supplied by the amplifier 10 changes the retardation of the modulator 16 such that it becomes a negative or positive retardation plate. Then because of the position of the optical axis of the light modulator 16, the circularly polarized light emerging from the beamsplitter PB 1 is always converted into linearly polarized light oscillating in the original 45° zero plane. When the electrical loop circuit is properly adjusted, the light modulator will always convert any circularly or elliptically polarized light emerging from the beamsplitter PB 1 into linearly polarized light oscillating in the zero plane.

Additionally, in FIG. 6 the light from the laser system which controls the phtosensors 9a and 9b emerges from the optical circuit not through the end mirror 6 as shown in FIG. 1 and FIG. 5 but is deflected by the non-polarizing beamsplitter 15 inserted in the laser cavity. This beamsplitter 15 consists of a simple glass plate tilted at an angle close to the Brewster angle so that only a small amount of the laser light is deflected against a Wollaston prism 8 associated with photodetectors 9a and 9b connected with the resistor 14 in a bridge circuit.

The λ/4 plate 7 remains in the optical circuit of FIG. 6 only to convert the remaining portions of circular polarization which are not converted by the light modulator 16 onto linearly polarized light.

The additional beamsplitter 15 is, of course, not absolutely necessary. The photodetectors could be arranged in the same way as shown in FIG. 5, receiving their light through the end mirror 6. But then again the plane of polarization would rotate a little in the gain medium. In constrast, with the arrangement of FIG. 6 utilizing the additional beamsplitter 15, a practically zero error-rotation of the polarization plane can be achieved. In fact, if the analyzer system is sensitive enough to detect phase shifts of only one trip of the light around the loop, which is feasible, then not the slightest change in the light of the gain medium occurs. In the arrangement of FIG. 6, the angle of rotation in inertial space is indicated by a counter 11, or in some other known way.

Another feature is that no zero shift caused by the Fizeau effect exists in this system. Any error caused by gas flow in the amplifier medium 5 is automatically compensated for because every part of the light beam travels through the same point of the gain medium a second time in opposite direction. It should be feasible also to use as a laser a Ga As diode laser, in particular in the case in which the plane of polarization in the gain medium is prevented from rotating.

The discussion illustrates that with the laser system delineated in this invention a simple very accurate laser gyro of small size is feasible.

OTHER MODIFICATIONS

Figure 7:
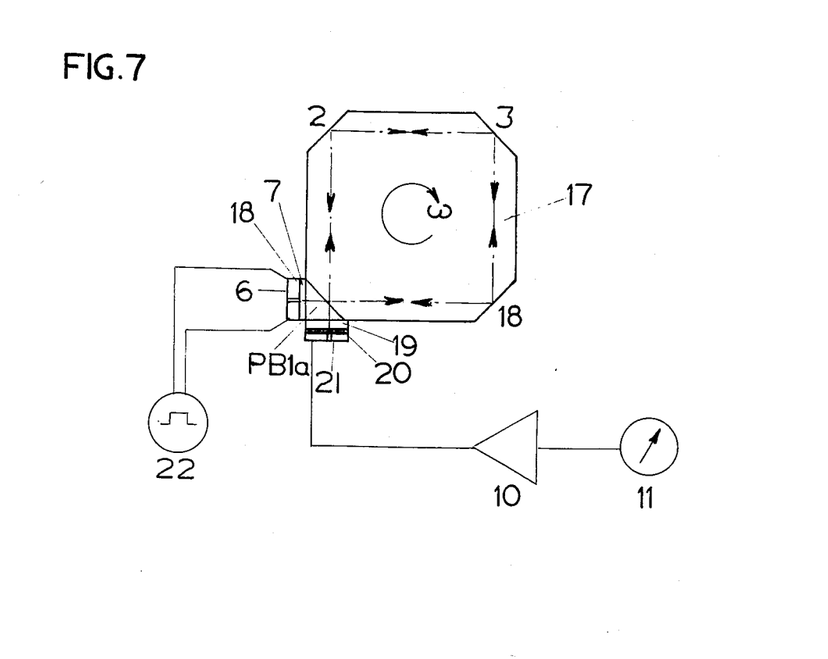
FIG. 7 is a schematic diagram of still another modified system.
Figure 8:
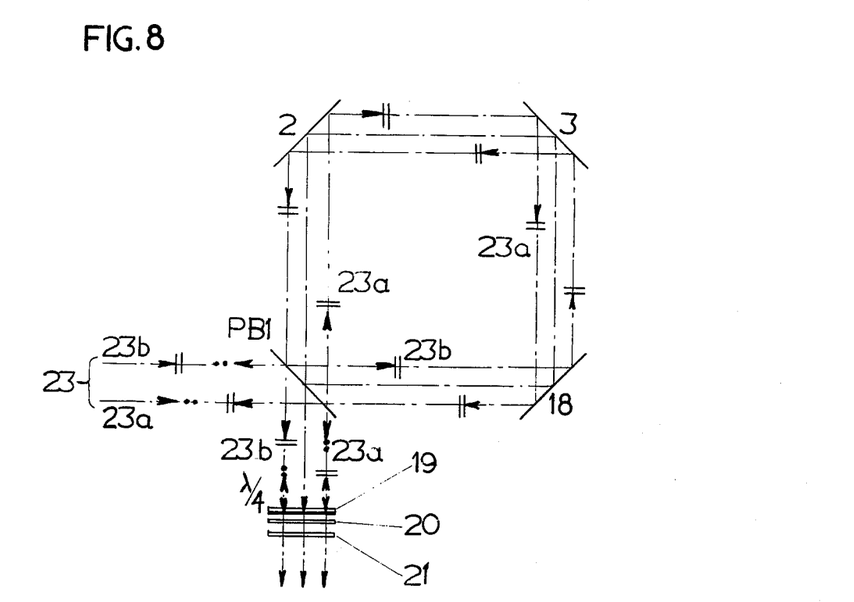
FIG. 8 is a schematic ray diagram of the system shown in FIG. 7.

If a Ga As diode in place of a He Ne gain medium is applied, a rate sensor of very small dimensions is feasible. FIGS. 7 and 8 illustrate such a design.

The loop in FIG. 7 consists of the square shaped prism 17 out of sintered quartz. This prism forms simultaneously the one half of the polarizing beamsplitter PB 1 shown in the previous configurations (FIGS. 1, 5 and 6). Only the part PB 1a of the polarizing beamsplitter has the triangular shape as before. The second half of the polarizing beamsplitter also functions simultaneously as part of the optical loop. The corners of the quartz body 17 are cut in such a way as to serve as the corner mirrors 2, 3 and 18. As the result, the quartz body 17 becomes an octagon. At the fourth corner of the quartz body 17, the part PB 1a of the polarizing beamsplitter is attached.

In front of the prism PB 1a, a quarter wave plate 7, the purpose of which has been discussed above, is arranged in the same way as in the optical circuits discussed above. The optical axis of the quarter wave plate 7 is rotated 45° to the plane of the paper as described above. In FIG. 7, the position of the optical axis of the plate 7 is not discernible.

The Ga As diode is placed in front of the plate 7 and takes the place of the He Ne discharge tube 5 in the previously discussed optical circuits. The outer surface of the Ga As diode 18 may be equipped with a reflecting coating 6, which reflects the light in the same manner as the mirror 6 of the previous configurations. The diode 18 receives its electrical power from the generator 22.

On the other side of the isosceles triangular part PB 1a, another quarter wave plate 19 is attached, the optical axis of which again is rotated at an angle of 45° with respect to the paper plane. This quarter wave plate replaces the half wave plate 4 of the previous circuits. The outer side of the plate 19 is equipped with a reflective coating which allows a small fraction of the light to pass through. This fraction of the transmitted light passes through the polarization analyzer sheet 20 to the photo sensor 21. The photo current generated in the photo sensor 21 is amplified by the amplifier 10 and indicated by the instrument 11.

The instrument 11 can be a simple counter to count the light fluctuations at the light sensor 21 or a meter which measures the degree of polarization conversion, i.e., the phase shift angle between the two opposite traveling light components in the optical loop, depending on the special kind of arrangement, as discussed later. The analyzer sheet 20 adjacent to plate 19 can consist of a simple polarizing sheet or it can be a Nicol or Wollaston prism depending again on the desired system, that is, if the fluctuations or only small phase shift angles are to be ascertained.

The ray trace of the light is illustrated in FIG. 8. The light beam 23 emanating from Ga As diode 18 is polarized by the polarizing beamsplitter in two orthogonal linear polarized components 23a and 23b in the same way as discussed before. The plane of polarization in which the light of the components oscillates is indicated in FIG. 8 by dots and dashes and the direction of the light by the arrow heads behind them. Two dots means the light component is oscillating perpendicular to the paper plane; two parallel dashes mean the light component is oscillating parallel to it.

Considering first the light component 23a which is oscillating perpendicular to the paper plane, i.e., perpendicular to the plane of incidence in the polarizing beamsplitter PB 1, this light component is deflected in direction to quarter wave plate 19. Because most of the light is reflected by the reflecting coating of plate 19, it will return to the beamsplitter PB 1. But, as a result of the two passes of the light through the quarter wave plate 19, the plate 19 acts as a half wave plate. It rotates the plane of oscillation of the twice transmitted linear polarized light at an angle of 90°, in the same way as the half wave plate 4 in the configurations, discussed above.

Since the returning light component oscillates now parallel to the plane of incidence of the beamsplitter PB 1, it will be transmitted this time and travel clockwise around the loop. After its voyage around the loop, it can pass again straight through the beamsplitter PB1 to the Ga As diode 18, as indicated in FIG. 8.

In contrast, the light component 23b, which is oscillating parallel to the plane of incidence of the beamsplitter PB 1, passes straight through at the beginning. This component 23b will travel counterclockwise around the loop and then pass through beamsplitter PB 1 to the quarter wave plate 19. Here it is reflected in the same way as the other light component and the plane of oscillation is rotated at an angle of 90°. Thus, the light component 23b returning from plate 19 is oscillating now in a plane perpendicular to the plane of reflection of the beamsplitter PB 1. It is reflected, therefore, and returns to the Ga As diode. Basically, the prevailing situation is identical here to that of the configurations discussed before.

With this special ring laser configuration, there are different ways of operation feasible. One way is to utilize a continuous wave Ga As diode. In this case, the light intensity at the photo diode 21 will fluctuate when the system is exposed to an angular rate $\omega$. The frequency of fluctuation will be proportional to $\omega$ as in case with the normal He Ne gas ring laser. The situation is the same as described in connection with FIG. 1. The light in the Ga As diode would be linearly polarized and the plane of polarization rotates with an angular rate which is proportional to the angular rate $\omega$ of the system in inertial space.

Instead of counting the light fluctuations, the degree of polarization conversion caused by the angular rate $\omega$ could be monitored also be using an ellipsometer arrangement in place of the simple polarizer sheet 20. In this way small angular rates $\omega$ could be measured after much shorter time intervals in contrast to counting the light intensity fluctuations. As a result, the quartz body 17 can be kept much smaller. The time to obtain the measurement of a small angle will be orders of magnitude shorter than the time required to count light fluctuations.

It is feasible, of course, here also to apply the methods discussed in connection with FIGS. 5 and 6 in order to prevent the rotation of the plane of oscillation of the linearly polarized light in the Ga As diode.

Another method to utilize the configuration of FIG. 7 is to apply a pulsed Ga As diode. This can be achieved simply by using a pulse generator 22. A pulsed Ga As diode results in a rate sensor which measures the angular rate $\omega$ instead of the angle.

If the Ga As diode is pulsed such that the length of the pulses and interval between the pulses are constant, the photo current induced in the photo sensor 21 is proportional to the angular rate $\omega$. The instrument 11, which could be a simple ammeter, would measure the amplified photo current and the deflection would be indicative of the angular rate $\omega$. Since with an ellipsometer arrangement, very minute changes in the polarization conversion are detectable, the quartz body 17 again could be of small dimensions.

Instead of utilizing light pulses of constant duration, their length could be varied in such as way as to obtain constant photo current output at the photo sensor 21. In this case, the length of the light pulse of the Ga As diode would be controlled such that the photo current induced in the photo sensor 21 remains constant. The length of the light pulse then would be the measure of the angular rate $\omega$.

Finally, it may be mentioned that other kinds of solid lasers, like a glass laser, etc., could be applied in place of the Ga As diode. In the same way, modifications of the quartz body 17 are feasible. The light beam need not travel through the quartz body itself, but could travel through a channel in the quartz body.

It is clear with the principle described a ring laser of smallest dimension is feasible. This guarantees at the same time that the corner mirrors 2, 3 and 18 which are part of the small cintered quartz body 17 are prevented from any movement relative to one another which results in errors. The same holds true for the beasmplitter part PB 1a, the quarter wave plate 7 and 19, the Ga As diode, etc., which can be attached rigidly also to the quartz body 17. This shows with the system discussed a small, robust rate sensor can be built which is resistant and immune to mechanical shock and environmental vibrations and at the same time highly accurate.

I claim:

1. A rotation sensitive ring laser system comprising
a laser gain medium,
a partially transparent end mirror positioned on one side of said laser gain medium, a splitting and reunifying device positioned on the opposite side of said laser gain medium for splitting a beam of polarized light from said laser gain medium into two orthogonal linear polarized components comprising an ordinary ray and an extraordinary ray, and for reunifying said components, a plurality of means defining reflective surfaces positioned in a manner such as to provide an optical loop defining a closed path for said components of light to transit in opposite directions, said splitting and reunifying device being positioned in said loop, said laser gain medium being positioned externally of said loop and directing light to the splitting and reunifying device and receiving light from the splitting and reunifying device, and means between the gain medium and the splitting and reunifying device for converting the light emanating from the loop that has been circularly polarized in response to rotation of the loop in inertial space into linearly polarized light, the plane of oscillation of which is rotating at an angular rate proportional to the angular rate with which the system is rotating in inertial space, and for converting said previously converted linearly polarized light as it returns from said laser gain medium into circularly polarized light rotating in the opposite direction from the circularly polarized light emanating from the loop such that each component of light which is circularly polarized by rotation in inertial space always travels in the same direction around the loop and the phase shift angle between the two components of light caused by the angular rate at which the system is rotating in inertial space successively increases with each successive path around the loop.

2. The rotation sensitive system set forth in claim 1 wherein said last-mentioned means comprises a quarter wave plate positioned in the paths of the light, said quarter wave plate having its principal optical axes parallel and perpendicular to the oscillating plane of the linearly polarized light from said gain medium incident on the splitting and reunifying device.

3. The rotation sensitive system set forth in claim 1 including means for analyzing the angular rate in inertial space by converting the angular rate into pulses and counting the rate of the pulses.

4. The rotation sensitive system set forth in claim 3 wherein said last-mentioned means comprises a partially transparent mirror forming part of the laser, polarizing means for polarizing the portion of light passing through said mirror, photodetector means, and counting means for counting the fluctuations of polarized light passing to said photodetector means.

5. The rotation sensitive system set forth in claim 1 including means for analyzing the angular rate in inertial space by measuring the angle of rotation of the plane of oscillation of the linearly polarized light in the gain medium as the system is rotated in inertial space.

6. The rotation sensitive system set forth in claim 5 wherein said last-mentioned means comprises a half wave plate in the path of the light, servo means for rotating said half wave plate, a transparent reflecting surface forming part of the laser system, a polarization analyzer receiving a portion of the light passing through said transparent reflecting surface for dividing said light into two orthogonal polarized components, photodetectors for receiving the light passing through the polarizing means, and means responsive to the difference in current of said photodetectors, said photodetectors operating said servo to rotate the half wave plate by means of said servo at an angular rate such that the plane of polarization in the medium is always kept in zero position.

7. The rotation sensitive system set forth in claim 3 wherein said last-mentioned means comprises a retardation modulator in the laser cavity, a non-polarizing beamsplitter inserted in the laser cavity, polarizing means in the path of the light reflected from said last-mentioned means, photodetectors for receiving the light passing through said last-mentioned polarizing means, an amplifier, signal means from said amplifier for applying a signal to said retardation modulator, and counter means operable by said photodetector means for producing a count proportional to the rate of rotation of the system in inertial space.

8. The rotation sensitive system set forth in claim 1 wherein said means defining reflective surfaces comprises a part of a single prism, said single prism also forming a portion of the polarizing beamsplitter.

9. The rotation sensitive system set forth in claim 8 wherein said laser gain medium comprises a solid medium, a second quarter wave plate, means defining a reflective coating thereon receiving light from said loop and passing a portion thereof, polarization analyzing means in the path of light from said second quarter wave plate, photosensor means in the path of light passing through said polarizing means, and means for measuring the phase shift angle of the light passing through said polarizing means.

10. The rotation sensitive system set forth in claim 9 wherein said last-mentioned means comprises means for converting the current change in the photosensor means to pulses and counting the rate of pulses to said photosensor means.

11. The rotation sensitive system set forth in claim 9 wherein said last-mentioned means comprises means for measuring the rate of change of current to said photosensor means.

12. The rotation sensitive system set forth in claim 9 wherein said laser gain medium comprises a continuous wave medium such that the light intensity will fluctuate at a rate proportional to the angular rate of rotation of the system in inertial space.

13. The rotation sensitive system set forth in claim 9 wherein said laser medium comprises a pulsed laser gain medium with a constant interval between pulses such that the rate of the intervals will fluctuate in proportion to the angular rate of rotation of the system in inertial space.

14. The rotation sensitive system set forth in claim 9 wherein said laser gain medium comprises a pulsed medium wherein the light pulses have a constant duration such that length of the pulses will fluctuate in proportion to the angular rate of rotation of the system in inertial space.

15. The rotation sensitive system set forth in claim 8 including means for analyzing the angular rate in inertial space by converting the angular rate into pulses and counting the rate of the pulses.

16. The rotation sensitive system set forth in claim 15 wherein said last-mentioned means comprises a partially transparent mirror forming part of the laser, polarizing means for polarizing the portion of light passing through said mirror, photodetector means, and counting means for counting the fluctuations of polarized light passing to said photodetector means.

17. The rotation sensitive system set forth in claim 8 including means for analyzing the angular rate in inertial space by measuring the angle of rotation of the plane of oscillation of the linearly polarized light in the gain medium as the system is rotated in inertial space.

18. The rotation sensitive system set forth in claim 17 wherein said last-mentioned means comprises a half wave plate in the path of the light, servo means for rotating said half wave plate, a transparent reflecting surface forming part of the laser system, a polarization analyzer receiving a portion of the light passing through said transparent reflecting surface for dividing said light into two orthogonal polarized components, photodetectors for receiving the light passing through the polarizing means, and means responsive to the difference in current of said photodetectors, said photodetectors operating said servo to rotate the half wave plate by means of said servo at an angular rate such that the plane of polarization in the medium is always kept in zero position.

19. The rotation sensitive system set forth in claim 15 wherein said last-mentioned means comprises a retardation modulator in the laser cavity, a non-polarizing beamsplitter inserted in the laser cavity, polarizing means in the path of the light reflected from said last-mentioned means, photodetectors for receiving the light passing through said last-mentioned polarizing means, an amplifier, signal means from said amplifier for applying a signal to said retardation modulator, and counter means operable by said photodetector means for producing a count proportional to the rate of rotation of the system in inertial space.

20. The method of determining rotation in inertial space which comprises
splitting a beam of light from a laser gain medium into two orthogonal polarized components,
directing said components in opposite directions in an optical loop defining a closed path,
reunifying said components as they emanate from said loop into a single beam of light,
converting the light emanating from said loop that has been circularly polarized in response to rotation of the loop in inertial space into linearly polarized light, the plane of oscillation of which is rotating at an angular rate proportional to the angular rate with which the system is rotating in inertial space,
directing said linearly polarized light to said laser gain medium,
reflecting a portion of said linearly polarized light that has passed through said laser gain medium back through the gain medium,
converting said linearly polarized light as it returns from the laser gain medium into circularly polarized light rotating in the opposite direction from the circularly polarized light emanating from the loop,
directing said converted circularly polarized light to said loop such that each component of light which is circularly polarized by rotation in inertial space always travels in the same direction around the loop and the phase shift angle between the two components of light caused by the angular rate at which the system is rotating in inertial space successively increases with each successive path around the loop.

21. The method set forth in claim 20 including the steps of converting the rate of rotation of the plane into pulses and counting the pulses per unit time.

22. The method set forth in claim 20 including the steps of converting the rate of rotation of the plane into a current, the magnitude of which is proportional to the rate of rotation.

* * * * *